United States Patent
Li et al.

(10) Patent No.: US 12,322,924 B2
(45) Date of Patent: Jun. 3, 2025

(54) TUNABLE BROADBAND RANDOM OPTOELECTRONIC OSCILLATOR

(71) Applicant: Institute of Semiconductors, Chinese Academy of Sciences, Beijing (CN)

(72) Inventors: Ming Li, Beijing (CN); Zengting Ge, Beijing (CN); Tengfei Hao, Beijing (CN); Wei Li, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 863 days.

(21) Appl. No.: 17/456,179

(22) Filed: Nov. 23, 2021

(65) Prior Publication Data

US 2022/0166182 A1 May 26, 2022

(30) Foreign Application Priority Data

Nov. 24, 2020 (CN) .......................... 202011333003.9

(51) Int. Cl.
*H01S 3/13* (2006.01)
*H01S 3/00* (2006.01)
(Continued)

(52) U.S. Cl.
CPC ............ *H01S 3/302* (2013.01); *H01S 3/0064* (2013.01); *H01S 3/0085* (2013.01); *H01S 3/06716* (2013.01); *H01S 3/06725* (2013.01); *H01S 3/094046* (2013.01); *H01S 3/1305* (2013.01); *H01S 3/1618* (2013.01); *H01S 3/2391* (2013.01); *H03B 17/00* (2013.01); *H01S 3/005* (2013.01); *H01S 3/06754* (2013.01)

(58) Field of Classification Search
CPC ...... H01S 3/005; H01S 3/0085; H01S 3/1305; H01S 3/2391; H03B 17/00
See application file for complete search history.

(56) References Cited

U.S. PATENT DOCUMENTS

| | | | |
|---|---|---|---|
| 9,887,779 B2 * | 2/2018 | Kowalevicz | H04B 10/50572 |
| 2005/0123306 A1 * | 6/2005 | Ilchenko | G02B 6/29395 |
| | | | 398/161 |

(Continued)

*Primary Examiner* — Michael Carter
(74) *Attorney, Agent, or Firm* — Osha Bergman Watanabe & Burton LLP (57) ABSTRACT

The present disclosure provides a tunable broadband random optoelectronic oscillator, including: a laser light source configured to generate continuous laser light; a positive feedback loop formed by an intensity modulator, an optical circulator, an optical filter, an optical amplifier, a photodetector, an electric filter and an electric amplifier connected in sequence, wherein the positive feedback loop is configured to receive the continuous laser light to generate a microwave signal and achieve an optic-electro/electro-optic conversion; a Raman laser configured to generate Raman pump light; a wavelength division multiplexer having a first input terminal connected to the Raman laser and a second input terminal connected to the optical circulator; and a dispersion compensation fiber connected to an output terminal of the wavelength division multiplexer; wherein forward transmission laser light passing through the optical circulator and the Raman pump light are coupled into the dispersion compensation fiber through the wavelength division multiplexer.

10 Claims, 6 Drawing Sheets

(51) Int. Cl.
*H01S 3/067* (2006.01)
*H01S 3/094* (2006.01)
*H01S 3/16* (2006.01)
*H01S 3/23* (2006.01)
*H01S 3/30* (2006.01)
*H03B 17/00* (2006.01)

(56) References Cited

U.S. PATENT DOCUMENTS

2005/0248823 A1* 11/2005 Maleki .............. H04B 10/2575
359/245
2007/0153289 A1* 7/2007 Yilmaz ................. G01C 19/72
356/464

* cited by examiner

FIG. 8

TUNABLE BROADBAND RANDOM OPTOELECTRONIC OSCILLATOR

CROSS REFERENCE

This application claims the benefit of Chinese Patent Application No. 202011333003.9 filed on Nov. 24, 2020 in the Stage Intellectual Property Office of China, the content of which is incorporated herein by reference in entirety.

TECHNICAL FIELD

The present disclosure relates to a technical field of microwave photonics, in particular to a tunable broadband random optoelectronic oscillator, which may generate a broadband random microwave signal with a tunable bandwidth and a tunable center frequency.

BACKGROUND

A conventional optoelectronic oscillator is a self-oscillating closed loop. An optoelectronic oscillator constructed by an optoelectronic hybrid resonant cavity is used as a new type of microwave signal generator to generate a single-frequency microwave signal. A typical optoelectronic oscillator system mainly includes a laser, an electro-optic modulator, a delay unit, an optical amplifier, a photodetector, an electric amplifier, and other core devices. These devices may constitute a closed positive feedback system that may self-oscillate so as to generate a microwave signal when a loop gain is greater than a loop loss.

The optoelectronic oscillator may convert continuous light into a microwave signal by using a modulator and a detector. However, a conventional optoelectronic oscillator may only generate a single-frequency microwave signal due to a single ring cavity length. Such an optoelectronic oscillator has a limited function and may not be applied in more fields.

SUMMARY

A tunable broadband random optoelectronic oscillator is provided, including: a laser light source configured to generate continuous laser light; a positive feedback loop formed by an intensity modulator, an optical circulator, an optical filter, an optical amplifier, a photodetector, an electric filter and an electric amplifier connected in sequence, wherein the positive feedback loop is configured to receive the continuous laser light to generate a microwave signal and achieve an optic-electro/electro-optic conversion; a Raman laser configured to generate Raman pump light; a wavelength division multiplexer having a first input terminal connected to the Raman laser and a second input terminal connected to the optical circulator; and a dispersion compensation fiber connected to an output terminal of the wavelength division multiplexer; wherein forward transmission laser light passing through the optical circulator and the Raman pump light are coupled into the dispersion compensation fiber through the wavelength division multiplexer.

Further, the laser light source, the intensity modulator, the optical circulator, the Raman laser, the wavelength division multiplexer, the dispersion compensation fiber, the optical filter, the optical amplifier and the photodetector are connected by a fiber jumper; and the photodetector, the electric filter and the electric amplifier are connected by a cable.

Further, the dispersion compensation fiber generates Rayleigh backscattered light during a transmission process, and the Rayleigh backscattered light is introduced into the positive feedback loop via the optical circulator.

Further, the Raman laser is configured to provide a gain to the forward transmission laser light and the Rayleigh backscattered light.

Further, the dispersion compensation fiber has an open output terminal, the open output terminal of the fiber is angled cleaved at 0° to 10° at an end surface, and the open fiber output terminal has a length of 10 km.

Further, the laser light source is a low-power single-wavelength laser, and the Raman laser is a high-power single-wavelength laser.

Further, the optical amplifier is an erbium doped fiber amplifier.

Further, the optical filter is an optical band-pass filter, and a pass band of the electric filter contains a microwave signal with different frequency components.

Further, the tunable broadband random optoelectronic oscillator further includes a power splitter, wherein the power splitter is arranged between the photodetector and the electric filter, or the power splitter is arranged between the electric filter and the electric amplifier.

Further, the tunable broadband random optoelectronic oscillator further includes an optical isolator arranged between the intensity modulator and the optical circulator, wherein the optical isolator is configured to allow only the continuous laser light signal to pass unidirectionally from the intensity modulator to the optical circulator.

REFERENCE NUMERALS

1—laser; 2—intensity modulator; 3—optical isolator; 4—Raman laser; 5—wavelength division multiplexer; 6—dispersion compensation fiber; 7—optical circulator;

8—optical filter; 9—optical amplifier; 10—photodetector; 11—power splitter; 12—electric filter; 13—electric amplifier

DETAILED DESCRIPTION OF EMBODIMENTS

In order to make objectives, technical solutions and advantages of the present disclosure clearer, the present disclosure will be further described in detail below in connection with specific embodiments and with reference to the accompanying drawings. Obviously, the described embodiments are only a part but not all of the embodiments of the present disclosure. Based on the embodiments in the present disclosure, all other embodiments obtained by those of ordinary skill in the art without carrying out any inventive effort fall within the protection scope of the present disclosure.

In addition, the terms "first" and "second" are used for descriptive purposes and may not be understood as indicating or implying relative importance or implicitly indicating the number of indicated technical features. Thus, the features defined as "first" and "second" may explicitly or implicitly include one or more of the features.

Figure 1:
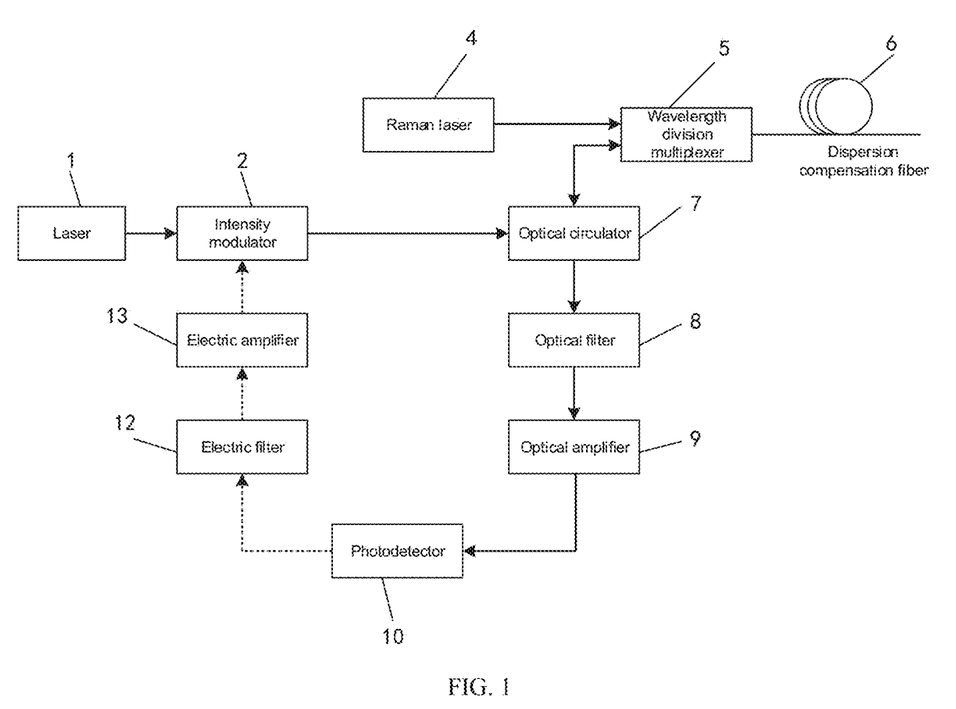
FIG. 1 is a schematic structural diagram of a tunable broadband random optoelectronic oscillator according to the embodiments of the present disclosure.

FIG. 1 is a schematic structural diagram of a tunable broadband random optoelectronic oscillator provided by the embodiments of the present disclosure.

As shown in FIG. 1, in the embodiments of the present disclosure, the tunable broadband random optoelectronic oscillator includes:

a laser light source 1 used to generate continuous laser light;

a positive feedback loop formed by an intensity modulator 2, an optical circulator 7, an optical filter 8, an optical amplifier 9, a photodetector 10, an electric filter 12 and an electric amplifier 13 connected in sequence, wherein the positive feedback loop is used to receive the continuous laser light to generate a microwave signal and achieve an optic-electro/electro-optic conversion;

a Raman laser 4 used to generate Raman pump light;

a wavelength division multiplexer 5 having a first input terminal connected to the Raman laser 4 and a second input terminal connected to the optical circulator 7; and a dispersion compensation fiber 6 connected to an output terminal of the wavelength division multiplexer 5;

wherein the wavelength division multiplexer 5 couples a forward transmission laser light passing through the optical circulator 7 and the Raman pump light into the dispersion compensation fiber 6.

In the embodiments of the present disclosure, the laser light source 1, the intensity modulator 2, the optical circulator 7, the Raman laser 4, the wavelength division multiplexer 5, the dispersion compensation fiber 6, the optical filter 8, the optical amplifier 9 and the photodetector 10 are connected by a fiber jumper; the photodetector 10, the electric filter 12 and the electric amplifier 13 are connected by a cable.

As shown in FIG. 1, in the embodiments of the present disclosure, an operating principle of the positive feedback loop is as follows. The continuous laser light generated by the laser light source 1 is modulated by the intensity modulator 2 and then enter the optical circulator 7, it is then converted into an electrical signal by the photodetector 10 after being filtered by the optical filter 8 and amplified by the optical amplifier 9. The electrical signal is converted into an optical signal by the intensity modulator 2 and enters the optical fiber after being filtered by the electric filter 12 and amplified by the electric amplifier 13.

It may be understood that a scattering process in the optical fiber may include a Rayleigh scattering caused by an inhomogeneity of a fiber medium, a Brillouin scattering generated by thermal vibration phonons, and a Raman scattering caused by an interaction of photons inside the optical fiber. The Rayleigh scattering does not change a wavelength, and only a loss of intensity exhibits during a propagation process in the optical fiber. The Brillouin scattering and the Raman scattering are both accompanied by an energy exchange with phonons, therefore the wavelength may be changed. A phenomenon that the laser light returns along an original optical path after the Rayleigh scattering is called a Rayleigh backscattering. An intensity of Rayleigh backscattered light is not a constant value, but exhibits a certain fluctuation, and the Rayleigh backscattered light is randomly distributed. In addition, the Brillouin scattering may also exist in a transmission process of the laser light in the optical fiber. Generated Stokes light propagates in an opposite direction to the laser light, and enters the positive feedback loop through the optical circulator 7 together with the Rayleigh backscattered light. When the loop oscillates, a laser light spectrum is broadened, which may increase a threshold of the Brillouin scattering, and then suppress a stimulated Brillouin scattering process. In this case, an influence of the Brillouin scattering may be ignored. In theory, the Raman scattering of the laser light may also exist in the optical fiber. However, in a case that an intensity of injected light does not reach a threshold, an influence of a spontaneous Raman scattering may be ignored. An intensity of the Rayleigh backscattered light depends on a length of the optical fiber, a uniformity of an internal refractive index and the intensity of the laser light, and is minimally affected by an external environment. In addition, the Rayleigh backscattered laser light generally has a small intensity which needs to be amplified.

Referring to FIG. 1, outside the positive feedback loop, an open ring cavity is formed by two input terminals of the wavelength division multiplexer 5 (the Raman laser 4 and the optical circulator 7) and the dispersion compensation fiber 6 at the output terminal.

In the embodiments of the present disclosure, the dispersion compensation fiber 6 may generate Rayleigh backscattered light during a transmission process, and the Rayleigh backscattered light is introduced into the positive feedback loop via the optical circulator 7. Specifically, since the continuous laser light and the Raman pump light simultaneously exist in the dispersion compensation fiber 6 during the transmission process, that is, the fiber medium has a characteristic of uneven refractive index, the dispersion compensation fiber 6 may generate the Rayleigh backscattered light.

The Rayleigh backscattered light is randomly distributed, and is introduced into the positive feedback loop via the optical circulator 7, so that a length of the ring cavity of the positive feedback loop may vary continuously. Specifically, a randomness of the Rayleigh backscattered light makes a backscattered light power at each position fluctuate randomly, and the randomness is transferred from the optical signal to the electrical signal through the photodetector 10 in the positive feedback loop, so that the generated microwave signal has randomness as well. The randomly distributed Rayleigh backscattered light in the dispersion compensation fiber 6 may achieve the continuous variation of the ring cavity length of the positive feedback loop. The continuous variation of the cavity length enables microwave signals at different frequencies to oscillate in the ring cavity simultaneously, so as to generate a broadband random microwave signal.

The Rayleigh backscattered light is introduced into the positive feedback loop via the optical circulator 7, filtered by the optical filter 8 and amplified by the optical amplifier 9, and then enters the photodetector 10, the photodetector beats to generate a microwave signal, so as to achieve a closed feedback of a signal in the open ring cavity.

The dispersion compensation fiber 6 has an open output terminal, the open fiber terminal is angled cleaved at 0° to 10° at an end surface, and the open fiber end has a length of 10 km.

The Raman laser 4 may provide a gain to a forward transmission laser light passing through the optical circulator 7 and the Rayleigh backscattered light in the dispersion compensation fiber 6.

In some embodiments, the laser light source 1 is a low-power single-wavelength laser, and the Raman laser 4 is a high-power single-wavelength laser. In this case, by adjusting a power of the continuous laser light and a power of the Raman pump light, a power of the Rayleigh backscattered light may be large enough to meet a condition that a gain in the positive feedback loop is greater than a loss in the positive feedback loop, so as to achieve a self-excited oscillation of the microwave signal.

In some embodiments, the optical amplifier 9 is an erbium doped fiber amplifier. The erbium doped fiber amplifier has advantages of high gain, large bandwidth, high output power, high pumping efficiency, low insertion loss, and insensitivity to polarization, and is most widely used in optical fiber communications.

In the embodiments of the present disclosure, the optical filter 8 is an optical band-pass filter, and a pass band of the electric filter 12 contains microwave signals with different frequency components.

A bandwidth and a center frequency of the electric filter 12 may be selected according to actual needs. A tunability of the pass band may be achieved by replacing different electric filters, so that a tunable broadband random optoelectronic oscillator may generate a broadband random microwave signal with a tunable bandwidth and a tunable center frequency. Moreover, the pass band of the tunable broadband random optoelectronic oscillator is mainly determined by an operating bandwidth of the electric filter 12.

In some embodiments, in order to output and display the generated broadband random microwave signal, the tunable broadband random optoelectronic oscillator may further include a power splitter 11 used to split the electrical signal converted by the photodetector 10 into two ways. The power splitter 11 is arranged between the photodetector 10 and the electric filter 12, or the power splitter 11 is arranged between the electric filter 12 and the electric amplifier 13.

Figure 2:
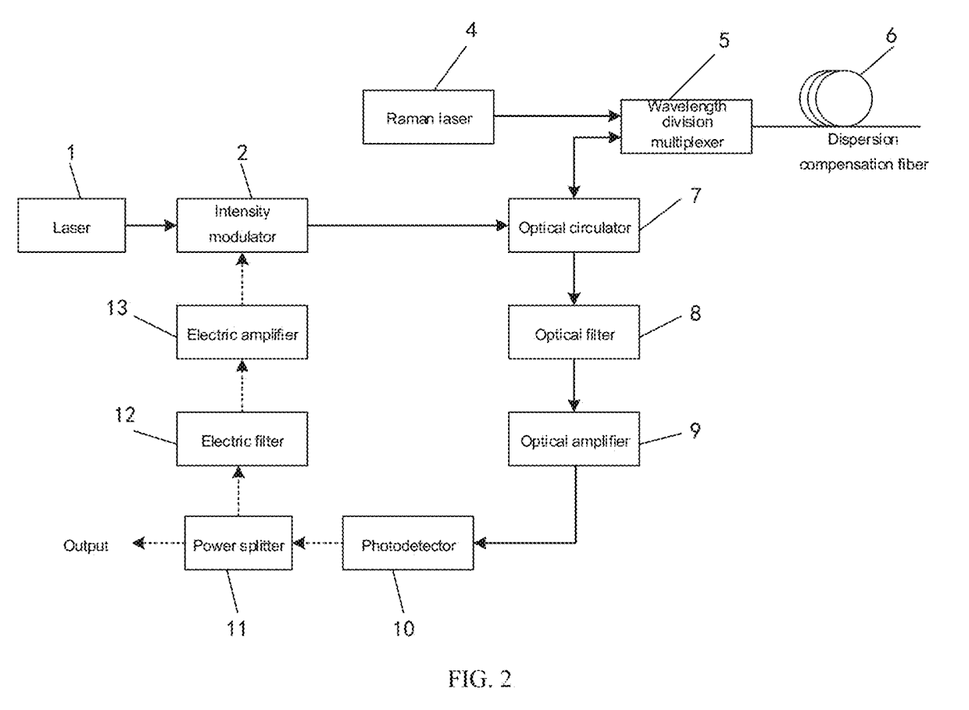
FIG. 2 is a schematic structural diagram of a tunable broadband random optoelectronic oscillator according to FIG. 1, where a power splitter is further provided between a photodetector and an electric filter.

For example, when the power splitter 11 is arranged between the photodetector 10 and the electric filter 12, the tunable broadband random optoelectronic oscillator is shown in FIG. 2.

Figure 3:
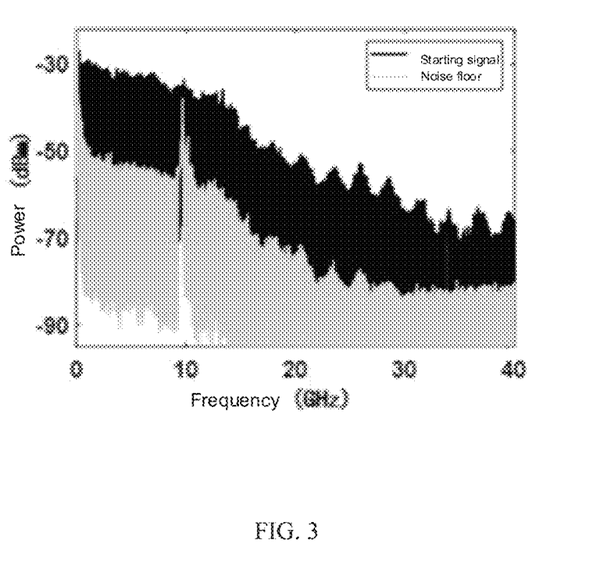
FIG. 3 is a spectrum diagram of an ultra-broadband random signal generated at an output terminal of the power splitter according to FIG. 2.

FIG. 3 is a spectrum diagram of an ultra-broadband random signal generated at an output terminal of the power splitter according to FIG. 2.

As shown in FIG. 3, since the pass band of the electric filter 12 may select a microwave signal with a specific frequency component to pass through, when the electric filter 12 is not provided in the positive feedback loop, that is, an extra-broadband random signal may be generated at the output terminal of the power splitter 11.

Figure 4:
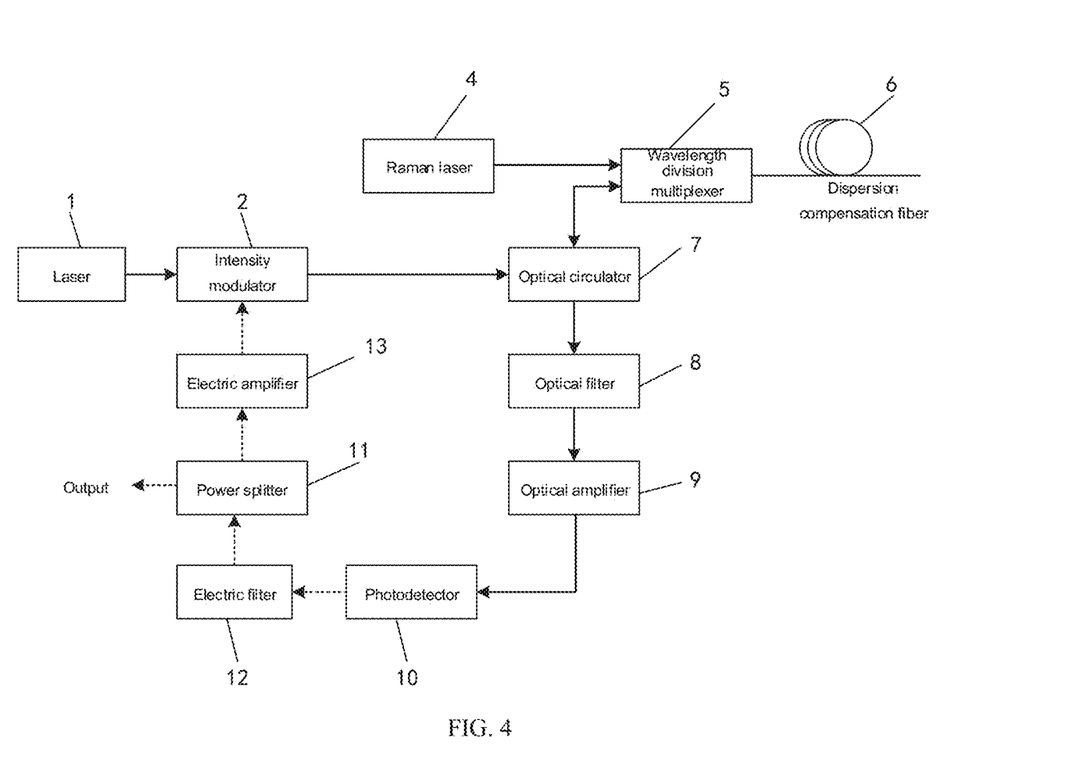
FIG. 4 is a schematic structural diagram of a tunable broadband random optoelectronic oscillator according to FIG. 1, where a power splitter is further provided between an electric filter and an electric amplifier.

For another example, when the power splitter 11 is arranged between the electric filter 12 and the electric amplifier 13, the tunable broadband random optoelectronic oscillator is shown in FIG. 4.

Figure 5:
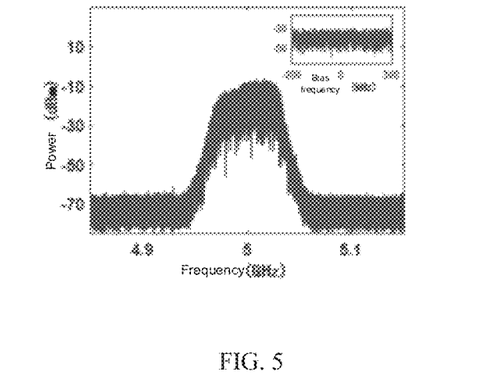
FIG. 5 is a spectrum diagram of a microwave signal generated at an output terminal of the power splitter according to FIG. 4 when an electric filter with a first pass band is used.
Figure 6:
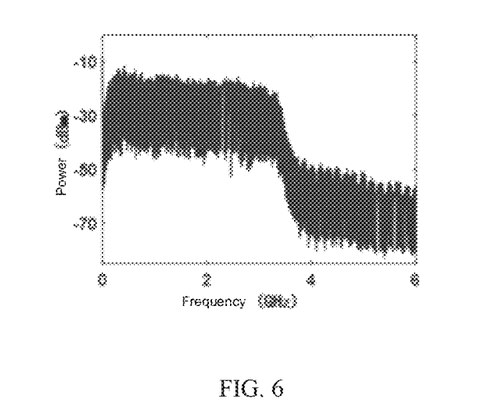
FIG. 6 is a spectrum diagram of a microwave signal generated at an output terminal of the power splitter according to FIG. 4 when an electric filter with a second pass band is used.
Figure 7:
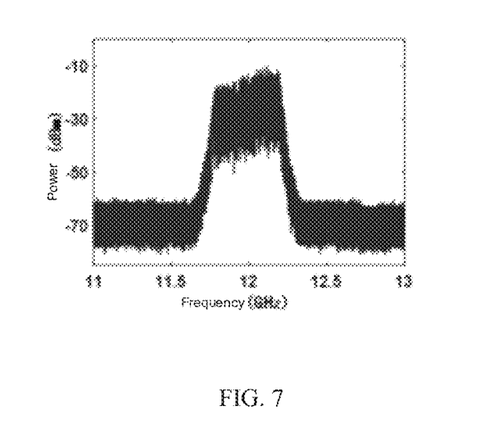
FIG. 7 is a spectrum diagram of a microwave signal generated at an output terminal of the power splitter according to FIG. 4 when an electric filter with a third pass band is used.

FIG. 5 is a spectrum diagram of a microwave signal generated at an output terminal of the power splitter according to FIG. 4 when an electric filter with a first pass band is used. FIG. 6 is a spectrum diagram of a microwave signal generated at an output terminal of the power splitter according to FIG. 4 when an electric filter with a second pass band is used. FIG. 7 is a spectrum diagram of a microwave signal generated at an output terminal of the power splitter according to FIG. 4 when an electric filter with a third pass band is used.

Referring to FIG. 5 to FIG. 7, since the pass band of the electric filter 12 may select a microwave signal with a specific frequency component to pass through, after an extra-broadband random signal generated by a beating of the photodetector 10 is filtered by the electric filter 12, a broadband random microwave signal may be generated at the output terminal of the power splitter 11. Moreover, since the electric filters 12 in FIG. 5 to FIG. 7 have different pass bands, a tunability of the pass band may be achieved by replacing different electric filters, and the tunable broadband random optoelectronic oscillator may generate a broadband random microwave wave signal with a tunable bandwidth and a tunable center frequency.

Referring to FIG. 2 to FIG. 7, an ultra-broadband random signal may be generated when no electric filter is provided in the loop; when the electric filter is provided in the loop, the microwave signal within the pass band may be selected by the selective filtering effect of the pass band of the electric filter to oscillate in the optoelectronic oscillator, and the electric filter may be replaced according to actual needs to select an appropriate bandwidth and an appropriate center frequency. The microwave signal of a frequency within the bandwidth of the filter may start, so that a broadband random optoelectronic oscillator with a tunable bandwidth and a tunable center frequency is achieved. Moreover, the pass band of the tunable broadband random optoelectronic oscillator is mainly determined by the operating bandwidth of the electric filter.

Referring to FIG. 1, an operating principle of the tunable broadband random optoelectronic oscillator of the present disclosure is described in detail as follows. Firstly, the continuous laser light is output from the laser 1 and modulated by the intensity modulator 2, after passing through the optical circulator 7, it is coupled to the dispersion compensation fiber through the wavelength division multiplexer 5 together with the Raman pump light emitted from the Raman laser 4. Secondly, due to the uneven refractive index of the dispersion compensation fiber 6, the Rayleigh scattering exists during the transmission processing. The Rayleigh backscattered light is re-captured by the optical fiber and propagated in an opposite direction. Through a stimulated Raman scattering, the Raman pump light may perform an amplification gain on both the forward transmission light passing through the optical circulator 7 and the Rayleigh backscattered light, and the Rayleigh backscattered light is introduced into the positive feedback loop by the optical circulator 7. Thirdly, after other gain bands of the Raman pump light are filtered out by the optical filter 8, the Rayleigh backscattered light is further amplified by the optical amplifier 9. After a beating of the photodetector 10, a self-excited oscillating microwave signal may be obtained. Finally, the electric filter 12 selects the microwave signal within the pass band to pass through, which is then amplified by the electric amplifier 13 and fed back to the intensity modulator to modulate the continuous laser light, so that a closed feedback of the signal in the open ring cavity may be achieved.

Figure 8:
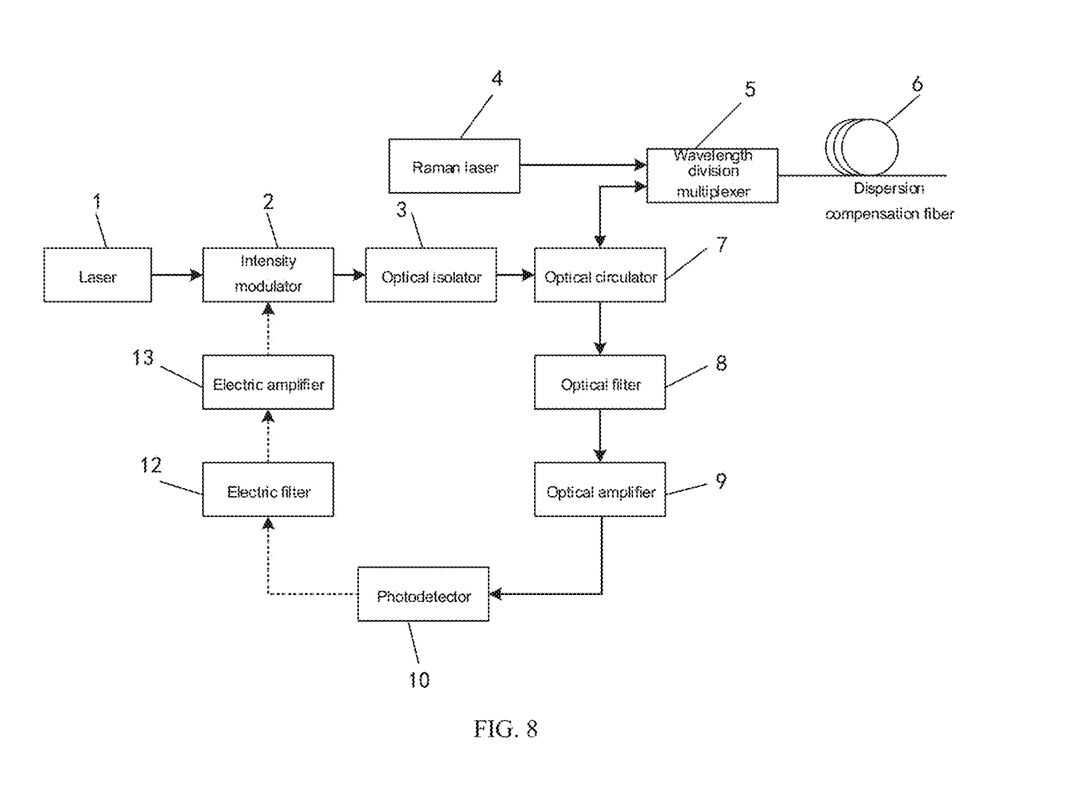
FIG. 8 is a schematic structural diagram of a tunable broadband random optoelectronic oscillator according to FIG. 1, where an optical isolator is further provided.

In some embodiments, as shown in FIG. 8, the tunable broadband random optoelectronic oscillator may further include an optical isolator 3 arranged between the intensity modulator 2 and the optical circulator 7. The optical isolator 3 is used to allow only the continuous laser light signal to pass unidirectionally from the intensity modulator 2 to the optical circulator 7. That is to say, the optical isolator 3 connected between the intensity modulator 2 and the optical circulator 7 may effectively suppress the Rayleigh backscattered light introduced from the optical circulator 7 in the closed feedback loop from returning to the laser, so as to ensure a stable operating state of the laser and reduce a noise of the system caused by the reflected light.

In summary, the embodiments of the present disclosure provide a tunable broadband random optoelectronic oscillator, which is implemented to use an inherent Rayleigh scattering randomly distributed in an optical fiber as a feedback mechanism. Rayleigh backscattered light may achieve a closed-loop photoelectric feedback in an open ring cavity. Further, by replacing electric filters or optical filters with different pass bands, a microwave signal of a broadband continuous spectrum with a tunable bandwidth and a tunable center frequency may be generated. The tunable broadband random optoelectronic oscillator may be applied in secure communication systems, radar communications, electronic countermeasures, random number generations, and other fields.

Compared with the related art, the present disclosure has achieved at least the following beneficial effects.

First, a function of the optoelectronic oscillator is expanded from traditionally generating only a single-frequency microwave signal to generating a broadband random microwave signal with a tunable bandwidth and a tunable center frequency.

Second, signals with different frequency components may be stored simultaneously in the ring cavity of the optoelectronic oscillator. All frequencies within the pass band of the optoelectronic oscillator may start to oscillate to output a broadband random microwave signal. Moreover, the pass band of the optoelectronic oscillator is mainly determined by an operating bandwidth of the electric filter.

In addition, the above definitions of the various elements and methods are not limited to the specific structures, shapes or manners mentioned in the embodiments, the structure may be simply changed or replaced by those of ordinary skill in the art. For example, the electric filter 12 may be replaced with an optical band-pass filter, and the dispersion compensation fiber 6 may be replaced with a single-mode fiber. Moreover, the accompanying drawings are simplified and used as examples. The numbers, shapes and sizes of the components shown in the drawings may be adjusted according to actual situations, which is not limited in the present disclosure.

The specific embodiments described above describe the objectives, the technical solutions and the beneficial effects of the present disclosure in further detail. It should be understood that the above are only specific embodiments of the present disclosure, and are not intended to limit the present disclosure. Any modification, equivalent substitution, improvement, etc. made within the spirit and principle of the present disclosure should be included within the protection scope of the present disclosure.

What is claimed is:

1. A tunable broadband random optoelectronic oscillator, comprising:
a laser light source configured to generate continuous laser light;
a positive feedback loop formed by an intensity modulator, an optical circulator, an optical filter, an optical amplifier, a photodetector, an electric filter and an electric amplifier connected in sequence, wherein the positive feedback loop is configured to receive the continuous laser light to generate a microwave signal and achieve an optic-electro/electro-optic conversion;
a Raman laser configured to generate Raman pump light;
a wavelength division multiplexer having a first input terminal connected to the Raman laser and a second input terminal connected to the optical circulator; and
a dispersion compensation fiber connected to an output terminal of the wavelength division multiplexer;
wherein forward transmission laser light passing through the optical circulator and the Raman pump light are coupled into the dispersion compensation fiber through the wavelength division multiplexer.

2. The tunable broadband random optoelectronic oscillator of claim 1, wherein the laser light source, the intensity modulator, the optical circulator, the Raman laser, the wavelength division multiplexer, the dispersion compensation fiber, the optical filter, the optical amplifier and the photodetector are connected by a fiber jumper; and
the photodetector, the electric filter and the electric amplifier are connected by a cable.

3. The tunable broadband random optoelectronic oscillator of claim 1, wherein the dispersion compensation fiber generates Rayleigh backscattered light during a transmission process, and the Rayleigh backscattered light is introduced into the positive feedback loop via the optical circulator.

4. The tunable broadband random optoelectronic oscillator of claim 3, wherein the Raman laser is configured to provide a gain to the forward transmission laser light and the Rayleigh backscattered light.

5. The tunable broadband random optoelectronic oscillator of claim 1, wherein the dispersion compensation fiber has an open output terminal, the open output terminal of the fiber is angled cleaved at 0° to 10° at an end surface, and the open fiber output terminal has a length of 10 km.

6. The tunable broadband random optoelectronic oscillator of claim 1, wherein the laser light source is a low-power single-wavelength laser, and the Raman laser is a high-power single-wavelength laser.

7. The tunable broadband random optoelectronic oscillator of claim 1, wherein the optical amplifier is an erbium doped fiber amplifier.

8. The tunable broadband random optoelectronic oscillator of claim 1, wherein the optical filter is an optical band-pass filter, and a pass band of the electric filter contains a microwave signal with different frequency components.

9. The tunable broadband random optoelectronic oscillator of claim 1, further comprising a power splitter, wherein the power splitter is arranged between the photodetector and the electric filter, or the power splitter is arranged between the electric filter and the electric amplifier.

10. The tunable broadband random optoelectronic oscillator of claim 1, further comprising an optical isolator arranged between the intensity modulator and the optical circulator, wherein the optical isolator is configured to allow only the continuous laser light signal to pass unidirectionally from the intensity modulator to the optical circulator.

* * * * *